United States Patent
Quinn

(10) Patent No.: US 8,228,111 B2
(45) Date of Patent: Jul. 24, 2012

(54) BIAS VOLTAGE GENERATION FOR CAPACITOR-COUPLED LEVEL SHIFTER WITH SUPPLY VOLTAGE TRACKING AND COMPENSATION FOR INPUT DUTY-CYCLE VARIATION

(75) Inventor: Patrick A. Quinn, Beaverton, OR (US)

(73) Assignee: Avnera Corporation, Beaverton, OR (US)

( * ) Notice: Subject to any disclaimer, the term of this patent is extended or adjusted under 35 U.S.C. 154(b) by 0 days.

(21) Appl. No.: 12/154,285

(22) Filed: May 20, 2008

(65) Prior Publication Data

US 2009/0289685 A1 Nov. 26, 2009

(51) Int. Cl.
*H03K 17/56* (2006.01)
(52) U.S. Cl. .................. 327/423; 327/333
(58) Field of Classification Search ............ 327/423, 327/333; 326/80, 81
See application file for complete search history.

(56) References Cited

U.S. PATENT DOCUMENTS

| 7,124,221 B1* | 10/2006 | Zerbe et al. ............ 710/106 |
| 2008/0100342 A1* | 5/2008 | Muhlbacher et al. ....... 326/81 |
| 2009/0108888 A1* | 4/2009 | Gebara et al. ........... 327/148 |

* cited by examiner

*Primary Examiner* — Lincoln Donovan
*Assistant Examiner* — Diana J Cheng
(74) *Attorney, Agent, or Firm* — Joseph P. Curtin, L.L.C.

(57) ABSTRACT

A circuit architecture, or topology, that provides a level shifter substantially independent of the duty cycle of an input signal includes an H-bridge arrangement of field effect transistors, a pair of capacitively coupled input terminals connected to the gates of the high-side transistors and circuitry to set the bias voltage at the gates of the high-side transistors, wherein the bias voltage generation circuitry receives at least information indicative of both the H-bridge power supply voltage and the modulation of the input signal. Various embodiments include a switchable element coupled in series with a voltage divider portion in the bias voltage generation circuitry. The ratio of on to off time of the switchable element determines the average current through the voltage divider and thus the bias voltage. To prevent excessive short-circuit current flow through the high-side transistors, the switchable elements are turned off responsive to detection of a short-circuit condition.

20 Claims, 7 Drawing Sheets

BIAS VOLTAGE GENERATION FOR CAPACITOR-COUPLED LEVEL SHIFTER WITH SUPPLY VOLTAGE TRACKING AND COMPENSATION FOR INPUT DUTY-CYCLE VARIATION

FIELD OF THE INVENTION

The present invention relates generally to circuit architectures, or topologies, that provide level-shifters having biased input nodes capacitively coupled to pulse width modulated input signals, wherein the bias voltage is controlled so as to provide supply voltage tracking and to be substantially independent of variation in the input duty cycle.

BACKGROUND

Advances in semiconductor manufacturing technology have resulted in ever decreasing physical dimensions for the various circuit elements, such as, for example, field effect transistors, which are used in forming integrated circuits. In turn, the smaller dimensions of such circuit elements have allowed the integration onto a single chip of many more transistors than was possible in the past.

As is well-known in the field of integrated circuits, reducing the dimensions of circuit elements generally, and of the field effect transistor (FET) in particular, requires a corresponding reduction in the power supply voltage in order to avoid electric field strengths within the integrated circuit which might result in dielectric breakdown, or other adverse effects. Additionally, transistors of such small dimensions tend to have significant leakage current, or sub-threshold conduction, Therefore to maintain the power consumption of integrated circuits having a large number of small, i.e., "leaky" transistors at a reasonable level, it has become common to reduce the power supply voltage.

Even in circumstances in which leakage and dielectric breakdown are not issues, those skilled in the art of integrated circuit design recognize that lowering the supply voltage to a circuit is a significant factor in reducing power consumption.

In response to various motivations, such as those mentioned above, there has been an on-going trend to reduce power supply voltages. One consequence of this trend is that many systems or applications have various circuits with different voltage supply requirements. For example, a system may have some components that operate at 5 volts, and others that operate at 3.3 volts. Similarly, a single integrated circuit may have portions therein which operate at different voltages, for example, 3.3 volts and 1.8 volts. It will be appreciated that a signal that is generated in one voltage supply domain, may need to be level-shifted in order to properly interact with circuits that operate in a different power supply domain. In another example familiar to those skilled in the art, a control signal generated by an integrated circuit and having a first voltage range, is required to drive external circuitry which itself has an output at a second higher voltage, necessitating a level shift of the control signal voltage so that the control signal can be used to properly drive the transistors of the external circuitry operating at a higher voltage.

Various level-shifting circuits have been developed in order to provide the level-shifting functionality mentioned above. In a conventional arrangement, a resistive voltage divider between power and ground, with its intermediate node tied to the H-bridge drive transistor input gates is used to generate the DC bias voltage for the level-shift. Unfortunately, one drawback of conventional resistor divider type level-shifters of the H-bridge configuration with capacitively coupled input signals, is that the performance of such level-shifters is dependent upon the duty cycle of the input signals, and is further dependent on variations in the supply voltage.

What is needed are methods and apparatus for providing level shifters with capacitively coupled inputs that have performance characteristics which are substantially independent of the duty cycle of the input signals, and of variations in the supply voltage, and which are further operable to substantially turn off current flow when a short-circuit condition is detected.

SUMMARY OF THE INVENTION

Briefly, a circuit architecture, or topology, that provides a level shifter which is substantially independent of the duty cycle of an input signal and substantially independent of variation in the power supply voltage, includes an H-bridge arrangement of field effect transistors, a pair of capacitively coupled input terminals connected to the gates of the high-side (i.e., connected to the positive power supply) transistors and a pair of bias networks that each includes a voltage divider portion and a switchable device coupled in series between the voltage divider portion and ground.

In a further aspect of the present invention, each of the bias networks advantageously equipped with a switchable element, responsive to detection of a short-circuit condition, are operable to change the bias voltage such that at least the high-side transistors are turned off, thus preventing short-circuit current from flowing through those high-side transistors.

DETAILED DESCRIPTION

Figure 1:
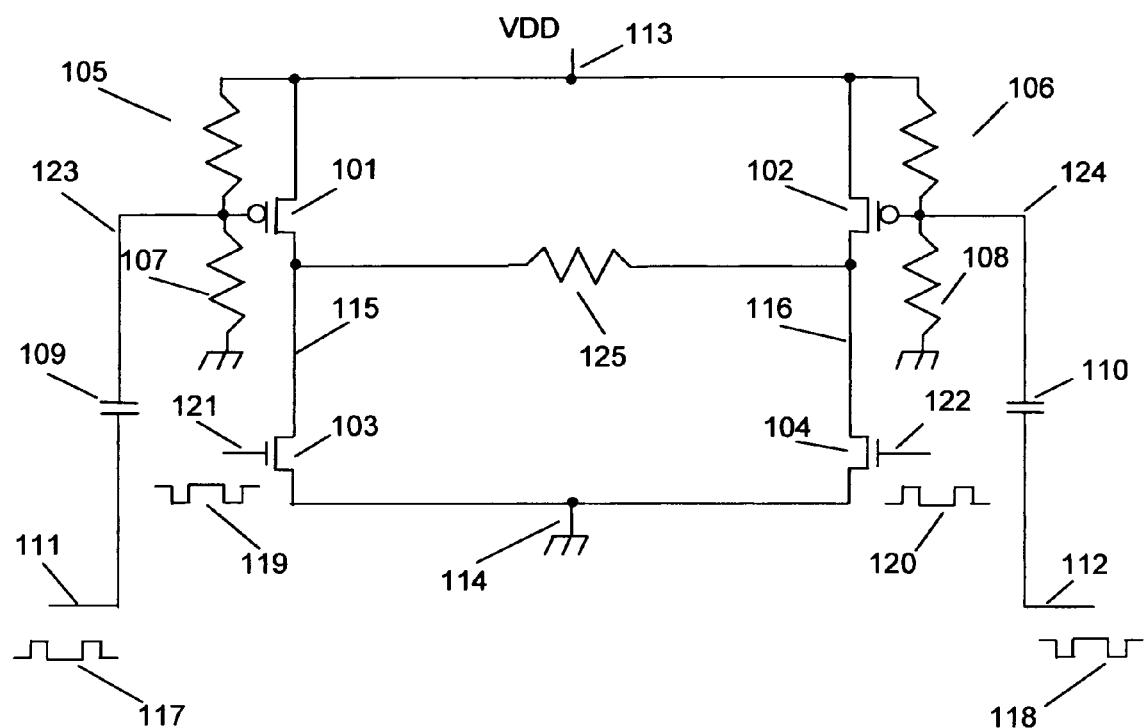
FIG. 1 is a schematic diagram of a conventional H-bridge circuit.

The following provides detailed descriptions of several approaches to biasing an H-bridge based level-shifter having capacitively coupled pulse-width modulated input signals, and concludes with descriptions of a generalized bias network architecture and short-circuit protection scheme.

Generally, the present invention relates to circuits and methods to capacitively level-shift a low-voltage digital signal to a high-voltage PFET gate drive, such as the high-side of an H-bridge, in such a way that the DC value of the gate drive is essentially independent of the duty cycle of the digital input signal. The present invention further relates to compensating a bias voltage produced by voltage divider networks such that the bias voltage that is provided to the high-side PFETs of the H-bridge is substantially independent of fluctuations in the power supply voltage. Various embodiments of the present invention may be configured to turn the high-side PFETs off when a short-circuit condition is detected.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The terms integrated circuit (IC), semiconductor device, monolithic device, microelectronic device, and chip are often used interchangeably in the field of electronics generally. The present invention is applicable to all the above as they are generally understood in the field.

Substrate, as used herein, refers to the physical object which is the basic workpiece that is transformed by various process operations into the desired microelectronic configuration. A substrate may also be referred to as a wafer. Wafers may be made of semiconducting, non-semiconducting, or combinations of semiconducting and non-semiconducting materials.

FET, as used herein, refers to metal-oxide-semiconductor field effect transistors (MOSFETs). These transistors are also known as insulated gate field effect transistors (IGFETs). As used herein, NFET refers to an n-channel FET, and PFET refers to a p-channel FET.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. It is noted that a FET can be viewed as a four terminal device when the semiconductor body is considered.

Source/drain (S/D) terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit. Generally, for an NFET the two S/D terminals are designated to be the drain and source for being coupled, respectively, to a more positive and a less positive voltage supply, while for a PFET the two S/D terminals are designated to be the source and drain for being coupled, respectively, to a more positive and a less positive voltage supply.

P-driver is an alternative expression used in the semiconductor industry to refer to a pull-up PFET.

Terminal refers to a connection point. Typically, outputs, or output terminals, are coupled to inputs, or input terminals, to propagate signals.

Back bias refers generally to the voltage from a p+ or n+ junction to its respective substrate. Other terms having substantially the same meaning are substrate bias, substrate voltage, well bias, well voltage, reverse bias and reverse voltage.

An H-bridge, sometimes referred to as a "full bridge", is a drive structure used in class-D amplifiers, motor drivers, switching power supplies, and other circuits. Generally, there are four switching elements within the bridge. These four elements, or switches, are turned on in pairs, either high left and lower right, or lower left and high right, but not both switches on the same "side" of the bridge. If both switches on one side of a bridge are turned on, a short circuit, or at least a relatively low-resistance path, is created between the power supply and ground. In some embodiments of the present invention, an 8-ohm load, such as a speaker, is connected across the outputs of the H-bridge. In other embodiments the loads may include other a speaker and filter circuitry. The present invention is not limited by the function, or intended application, of the load.

Referring to FIG. 1, a schematic representation of a conventional H-bridge is shown. A first resistor 105 is coupled between a power supply node 113 (Vdd) and node 123; and a second resistor 107 is coupled between node 123 and a ground node. A first capacitor 109 is coupled between node 123 and a first input node 111. A first PFET 101 is coupled source-to-drain between Vdd 113 and a node 115. The gate of PFET 101 is coupled to node 123. A first NFET 103 is coupled drain-to-source between node 115 and ground. A third resistor 106 is coupled between Vdd 113 and node 124; and a fourth resistor 108 is coupled between node 124 and ground. A second capacitor 110 is coupled between node 124 and a second input node 112. A second PFET 102 is coupled source-to-drain between Vdd 113 and a node 116. The gate of PFET 102 is coupled to node 124. A second NFET 104 is coupled drain-to-source between node 116 and ground. A fifth resistor 125 is coupled between nodes 115 and 116. It will be appreciated that resistor 125 represents a load impedance for the H-bridge. For example, if the H-bridge of FIG. 1 was used as a motor driver, then an electric motor would be connected in place of resistor 125.

Still referring to FIG. 1, signal 117 is provided at node 111, and signal 120 is provided at node 122. Signals 117 and 120 are approximately equal in terms of timing and voltage swing. Input signal 118 is provided at node 112, and input signal 119 is provided at node 121 (the gate of NFET 102). Signal 120 is provided at node 122 (the gate of NFET 104). Signals 118 and 119 are also approximately equal in terms of timing and voltage swing. It is noted that signals 119 and 120 are approximately differential with respect to each other; and similarly, signals 117 and 118 are approximately differential with respect to each other. Various combinations of the four drive FETs 101, 102, 103, 104 are used, that is, turned on, to couple the load impedance 125 between the power supply and ground. The polarity of the voltage applied to load impedance 125 depends on the polarities of the input drive signals 117, 118, which are essentially 180 degrees out of phase with each other, are typically repetitive, and have duty cycles that vary. Similarly, signals 119, 120 are also essentially 180 degrees out of phase with each other, are typically repetitive, and have duty cycles that vary. Drive signals 117 and 120 differ slightly, as do signals 119 and 118. The difference is in the timing of the edges, which is done to avoid turning on either FETs 101 and 103, or FETs 102 and 104 at the same time. Such timing relationships have historically been referred to in this field as "non-overlapping timing".

Still referring to FIG. 1, when input signal 117 is low and input signal 120 is high, then FETs 101 and 104 turn on, and consequently pull node 115 to the supply voltage and node 116 is pulled to ground. It is noted that the present invention does not limit the supply voltage (Vdd) to any particular value, and various embodiments may be connected to supply voltages of just a few volts to supply voltages of several hundred volts. When input signal 118 is low and input signal 119 is high then FETs 102 and 103 turn on, and consequently, pull node 115 to ground, and pull node 116 to the supply voltage Vdd. In this way, the H-bridge (FETs 101, 102, 103, 104) replicates the input drive signal across the load 125, but with a larger voltage swing. Typically, the resistance of resistor 105 is nominally equal to the resistance of resistor 106, and the resistance of resistor 107 is nominally equal to the resistance of resistor 108.

Still referring to FIG. 1, consider an illustrative example wherein V1=5 volts (i.e, the voltage swing of the input signals), and Vdd=25 volts. In this case, nodes 123 and 124 would typically be biased to a voltage defined by Vdd−½V1, or 22.5 volts. When the duty cycle of the input signals is 50%, this circuit arrangement works well. As the duty cycle of the input signals, however, moves away from 50%, node 123 and 124 seriously de-bias, which typically results in FETs 101 and 102 failing to fully turn on or off. This performance limitation is significant because it limits the useful range of input duty cycle, and may cause over-heating due to the increased power dissipation in the FETs. Conventional approaches to overcoming this limitation have required complicated drive interface circuitry.

Figure 2:
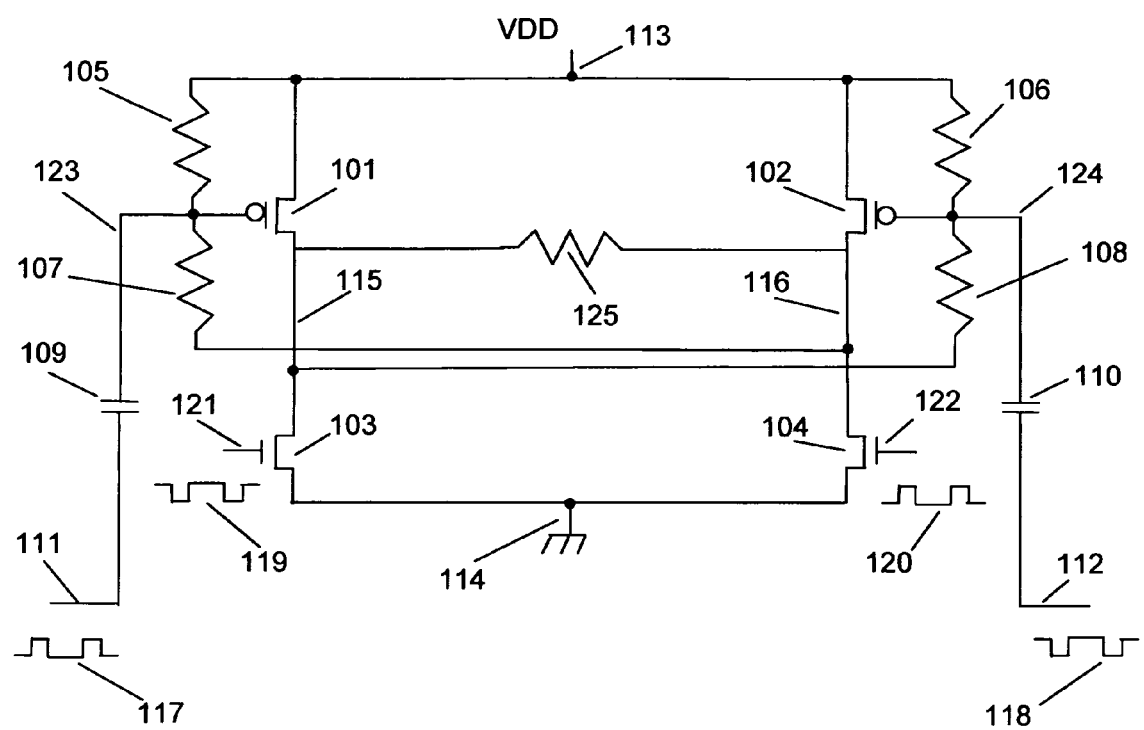
FIG. 2 is a schematic diagram of an H-bridge circuit in accordance with the present invention in which resistor connections of the conventional H-bridge circuit are changed so that rather than being coupled to ground, each of these resistors is coupled to the intermediate node on the opposite side of the H-bridge.

Referring to FIG. 2, a circuit in accordance with the present invention is shown. The elements of the circuit of FIG. 2 are the same as those shown in FIG. 1, however the interconnection of those elements is different. More particularly, resistor 107 is connected between node 123 and node 116, rather than between node 123 and ground as is shown in the conventional arrangement of FIG. 1. Similarly, resistor 108 is coupled between node 124 and node 115, rather than between node 124 and ground as is shown in the conventional arrangement of FIG. 1. This reconfiguration of circuit elements provides the correction needed to stabilize nodes 123 and 124 against variations in the duty cycle of input signals 117, 118, 119, and 120.

Still referring to FIG. 2, the bias stabilization, with respect to input signal duty cycle variation, is achieved by choosing the divide ratios of resistors 107, 105; and of resistors 108, 106, in a specific way. Consider the following definitions:

R107 is the resistance value of resistor 107
R105 is the resistance value of resistor 105
R108 is the resistance value of resistor 108
R106 is the resistance value of resistor 106
C109 is the capacitance value of capacitor 109
C110 is the capacitance value of capacitor 110
Vdd is the value of the H-bridge power supply
V1 is the logical high value of the voltage signals 117, 118, 119, and 120

Now, capacitor 109 and capacitor 110 are chosen to be much larger than the $C_{iss}$ values of PFETs 101 and 102. Thus, essentially 100% of the signal size of signal 117 is coupled to node 123, and essentially 100% of the signal size of signal 118 is coupled to node 124. If we choose divider ratio R105/(R107+R105), and divider ratio R106/(R108+R106), to be equal to V1/Vdd, then the AC (high frequency) solution for nodes 123 and 124 is the same as the DC (low frequency) solution for these nodes. The high-frequency path is provided by capacitors 109 and 110. The low-frequency path is provided by resistors 107 and 108. The impedance level (scaling) of resistors 105, 106, 107, 108 can be quite high. The time constant of (R105∥R107)*C109 needs to be slow enough so that capacitor 109 does not significantly discharge during the repetitive cycle of the input signal, which is typically several hundred kHz to a few MHz.

Figure 3:
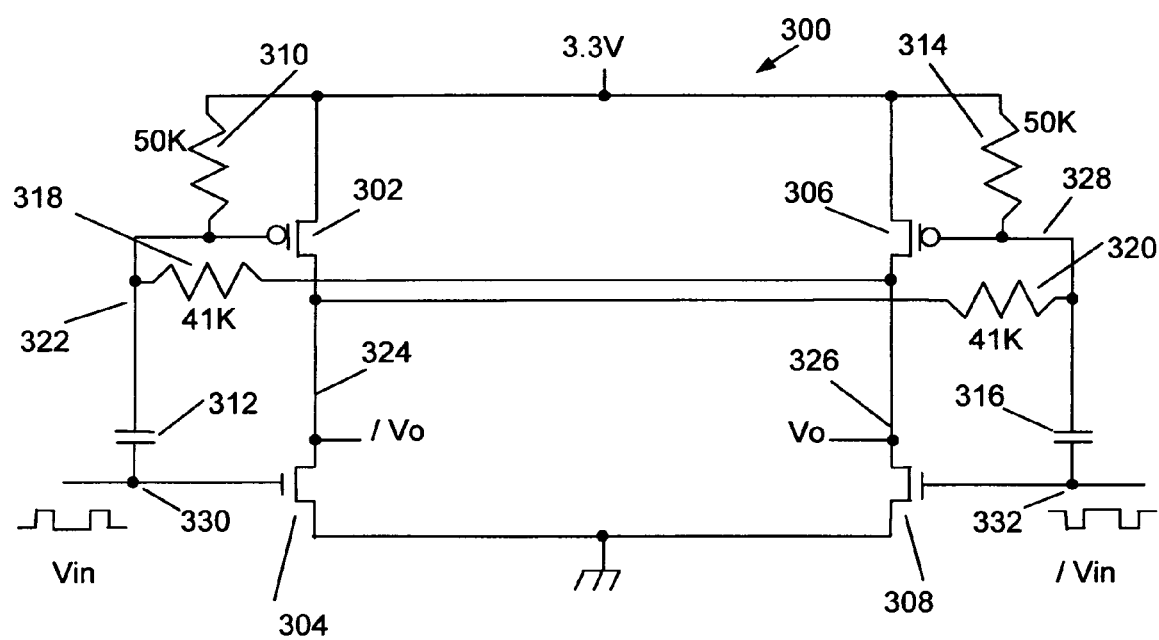
FIG. 3 is a schematic diagram of a capacitively-coupled level-shifter having duty-cycle independence in accordance with the present invention.

Referring to FIG. 3, a level shifter circuit 300 in accordance with the present invention is shown. In the illustrative example shown here, an input having a voltage swing of 1.8 volts is level-shifted so that the voltage swing is 3.3 volts. Vin and /Vin are differential input signals; and Vo and /Vo are differential output signals. Since the transistors of FIG. 3 can be very small, their $C_{ISS}$ will be extremely small. In view of this, the two capacitors shown can be small enough (e.g., hundreds of femto Farads) such that integration on the same integrated circuit with the transistors is practical. It is noted that the resistor values shown (50 KΩ and 41 KΩ) can be swapped in an arrangement to convert, or level-shift, from 3.3 volts to 1.8 volts. Various embodiments of the present invention are suitable for use with at least differential digital signals and provide for any arbitrarily selected magnitude of level-shifting with performance that is substantially independent of the duty cycle of the input signals.

As can be seen in FIG. 3, a CMOS implementation of level shifter 300 includes a first PFET 302 coupled source-to-drain between a first power supply node and node 324. A first NFET 304 is coupled drain-to-source between node 324 and ground. A second PFET 306 is coupled source-to-drain between the first power supply node and node 326. A second NFET 308 is coupled drain-to-source between node 326 and ground. A first resistor 310 is coupled, between the first power supply node and a node 322. A second resistor 318 is coupled between node 322 and node 326. Together, resistors 310 and 318 form a voltage divider, and, in operation act to produce a bias voltage at node 322 (i.e., the gate electrode of PFET 302). A first capacitor 312 is coupled between a node 330 and node 322, thereby providing a means for capacitively coupling an input signal onto the gate electrode of PFET 302. A third resistor 314 is coupled between the first power supply node and a node 328. A fourth resistor 320 is coupled between node 328 and node 324. Together, resistors 314 and 320 form a voltage divider, and, in operation act to produce a bias voltage at node 328 (i.e., the gate electrode of PFET 306). A second capacitor 316 is coupled between a node 332 and node 328, thereby providing a means for capacitively coupling an input signal onto the gate electrode of PFET 306.

When in operation, the first power supply node, shown in the illustrative embodiment of FIG. 3, has a nominal value of 3.3 volts with respect to the ground node. The input signals supplied at nodes 330 and 332 have nominal range of 0 to 1.8 volts with respect to the ground node. It will be appreciated that these voltage values are for illustrative purposes, and that the present invention is not limited to any particular voltages.

Level shifter circuit 300 is suitable for implementation as part of an integrated circuit. It will be appreciated that well-known electrical circuit elements, such as resistors and capacitors, may be constructed in integrated circuits.

By way of illustration and not limitation, the resistors shown in FIG. 3, may be implemented as segments of polycrystalline silicon, with or without ion implantation therein, as well as polycrystalline silicon having a silicide layer formed thereon with any suitable metal, including, but not limited to, titanium, molybdenum, cobalt, and nickel. Resistors may also be formed from doped regions of the substrate (e.g., junctions in the substrate or in a well, or a well itself, regardless of whether formed by diffusion of implantation). It is noted that while the substrate, or well, is generally formed from single crystal semiconductor material, such as silicon, the present invention further contemplates the use of amorphous semiconducting material, such as for example, amorphous silicon, and porous semiconducting materials, such as for example porous silicon, in which resistive elements may be formed. FETs may also be used as resistors when those FETs are biased so as permit at least some current flow. It will be appreciated that FETs are generally considered to have a linear and a non-linear region of operation with respect to the current flowing between drain and source as a function of the voltage therebetween. Generally, FETs are not used as resistors because the resistance of such a configuration is not independent of the voltage across the resistor. Serpentine structures formed of interconnect metal are sometimes used as resistive structures, although these tend to be quite large because of the relatively low resistivity of interconnect metals. It is noted that, any suitable structure that may be manufactured within an integrated circuit, and having a resistance within a predetermined range may be used as a resistor for implementation within an integrated circuit. It is further noted, that the present invention contemplates implementations in which one or more of the resistors, capacitors, and transistors is implemented as two or more physically separated elements that are electrically interconnected. For example, a particular resistance value may be obtained by combining two or more parallel and/or serially connected resistive elements. Analogously, particular capacitance values may be obtained by combining two or more parallel and/or serially connected capacitors. Similarly, FETs of a desired channel width can be constructed by combining two or more FETs (typically of the same channel length) in parallel.

It is noted that some or all of the resistors and/or capacitors may be implemented external to the integrated circuit containing the FETs.

With respect to capacitors 312, 316 shown in FIG. 3, it is noted that these capacitors may be implemented as metal-to-metal (i.e., two pieces of metal separated by a dielectric, as gate capacitor (i.e., gate electrode and FET body separated by gate dielectric, polysilicon-to-polysillicon (i.e., formed in a dual-layer polysilicon process), or as junction capacitors. The present invention comprehends any suitable structure for forming a capacitor on an integrated circuit, or provided external to such an integrated circuit. It will be appreciated that some of the aforementioned structures (e.g., junction capacitors and gate capacitors) may have capacitance values that are voltage variable.

In view of the variety of structural alternatives for the implementation of resistors and capacitors, it will be appreciated that the present invention encompasses a wide variety physical layouts.

In the illustrative embodiment of FIG. 3, first resistor 318 has a nominal resistance of 50 KΩ, second resistor 318 has a nominal resistance of 41 KΩ, third resistor 314 has a nominal resistance of 50 KΩ, and fourth resistor 320 has a nominal resistance of 41 KΩ.

Still referring to FIG. 3, it is noted that although the FETs are illustrated as three-terminal devices, it is to be understood that the appropriate values of back bias (i.e., well or substrate voltages) are applied during operation of the circuit. The present invention is not limited to the application of any particular back bias, and the present invention contemplates all combinations of well or substrate voltages that are suitable for the physical and electrical characteristics of the transistors and other components used to implement circuitry in accordance with the present invention.

It is noted that, for an integrated circuit implementation of the capacitively coupled H-bridge arrangement which performs the duty cycle independent level shifting of the present invention, a symmetrical layout is typically preferred so as to reduce or eliminate layout-induced performance variations between the two sides of the H-bridge.

It will be appreciated that a method in accordance with the present invention provides a bias network that operates in manner so as to provide a bias signal which will keep the performance of, for example, a level shifter, substantially independent of the duty cycle of an input signal. In an illustrative embodiment, such a method, includes providing a bias network, the bias network having an output node, and operable to provide a bias signal at the bias network output node; providing a first switching element, the first switching element having a control terminal coupled to the bias network output node, the first switching element further having a terminal coupled to a first power supply node, the first power supply node providing a first supply voltage; and capacitively coupling a signal onto the control terminal, the signal having a first voltage swing, and further having a first duty cycle; wherein the output of the bias signal varies such that an output of the first switching element is substantially independent of the first duty cycle. It will be appreciated the aforementioned switching element is typically implemented as a transistor. Field effect transistors generally operate as voltage-controlled devices, and so the bias network would provide a voltage signal, whereas bipolar transistors generally operate as current-controlled devices, and in this case the bias network would provide a current signal. The bias network may be comprised of resistive elements, such as resistors.

Figure 4:
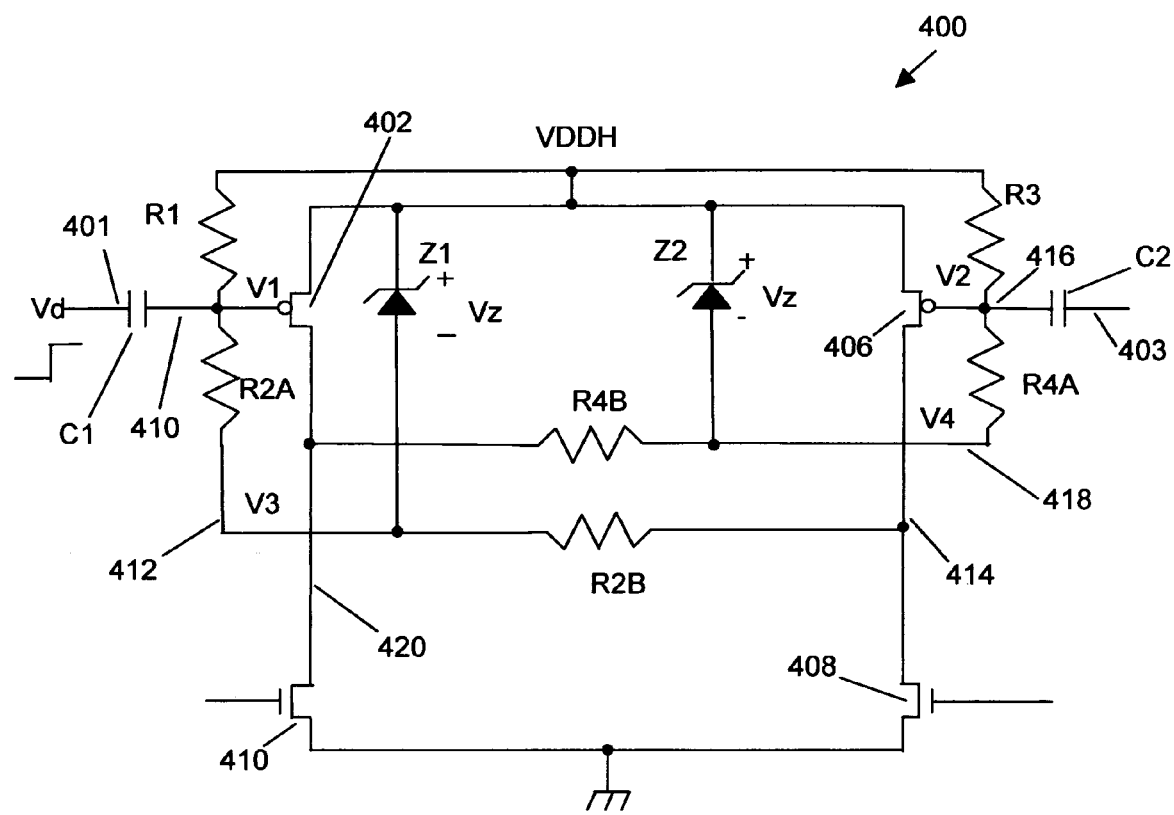
FIG. 4 is a schematic diagram of capacitively-coupled level-shifter having duty-cycle independence and power supply tracking in accordance with the present invention.

Referring to FIG. 4, a level-shifter circuit configuration 400 in accordance with the present invention is illustrated which is substantially independent of the duty cycle of the input signal and further substantially independent of variations in the power supply voltage. Such a circuit configuration may be referred to as supply-referenced, as opposed to the circuit shown in FIG. 3 which may be referred to as ground-referenced.

Still referring to FIG. 4, a first resistor R1 is coupled between a power supply node Vddh and node 410; a second resistor R2A is coupled between node 410 and a first intermediate node 412; and a third resistor R2B is coupled between first intermediate node 410 and a first output node 414. A first capacitor C1 is coupled between node 410 and a first input node 401. A first PFET 402 is coupled source-to-drain between Vddh and a node 420. The gate of PFET 402 is coupled to node 410. A first NFET 404 is coupled drain-to-source between node 420 and ground. A fourth resistor R3 is coupled between Vddh and a node 416; a fifth resistor R4A is coupled between node 416 and a node 418 and a sixth resistor R4B is coupled between nodes 418 and 420. A second capacitor C2 is coupled between node 416 and a second input node 403. A second PFET 406 is coupled source-to-drain between Vddh and a node 414. The gate of PFET 406 is coupled to node 416. A second NFET 408 is coupled drain-to-source between node 414 and ground. As shown in FIG. 4, a first zener diode Z1, having a first zener voltage, is coupled between first intermediate node 412 and Vddh, and a second zener diode Z2, having a second zener voltage, is coupled between second intermediate node 418 and Vddh. In this illustrative embodiment the voltage at node 410 is referred to as V1, the voltage at node 416 is referred to as V2, the voltage at node 412 is referred to as V3, and the voltage at node 418 is referred to as V4. While this illustrative embodiment includes zener diodes, it is noted that alternative embodiments may use any circuit element or combination of circuit elements that act as a constant voltage-drop element.

In the illustrative embodiment of FIG. 4, the FETs of the H-bridge are discreet power FETs; and the resistors, capacitors, and zener diodes are also discreet components. Those skilled in the art and having the benefit of this disclosure will appreciate that two or more of these discreet components may be integrated onto a single integrated circuit.

In a ground-referenced implementation the DC control of V1/V2 is achieved through the switching to ground and Vddh of the sides of R2/R4 which are connected to the FET drains. Whereas, in a supply-referenced implementation the DC control of V1/V2 is achieved through the pulse width waveform of V3/V4. These signals switch between (Vddh−Vz) and ground. So the proper setting for the resistors changes from R2/R1=(Vddh/Vd)−1 to R2A/R1=(Vz/Vd)−1. For example, if Vd=5V, Vddh=25V, and Vz=10V, then R2A/R1=10/5−1=2−1=1. Thus for even large changes in Vddh, the bias of V1/V2 stays put in the face of PWM on Vd. The only variation that remains is from the change in Vz that arises from changes in bias current changing because Vddh is changing. That is, Iz=(Vddh−Vz)/R2B is the current through Vz.

$$\frac{\partial Vz}{\partial Iz}$$

is the variation. For even reasonably good zener diodes, this variation is small compared to the debiasing of V1/V2 in the ground-referenced implementation.

Generalized Architecture and Short-Circuit Protection

Figure 5:
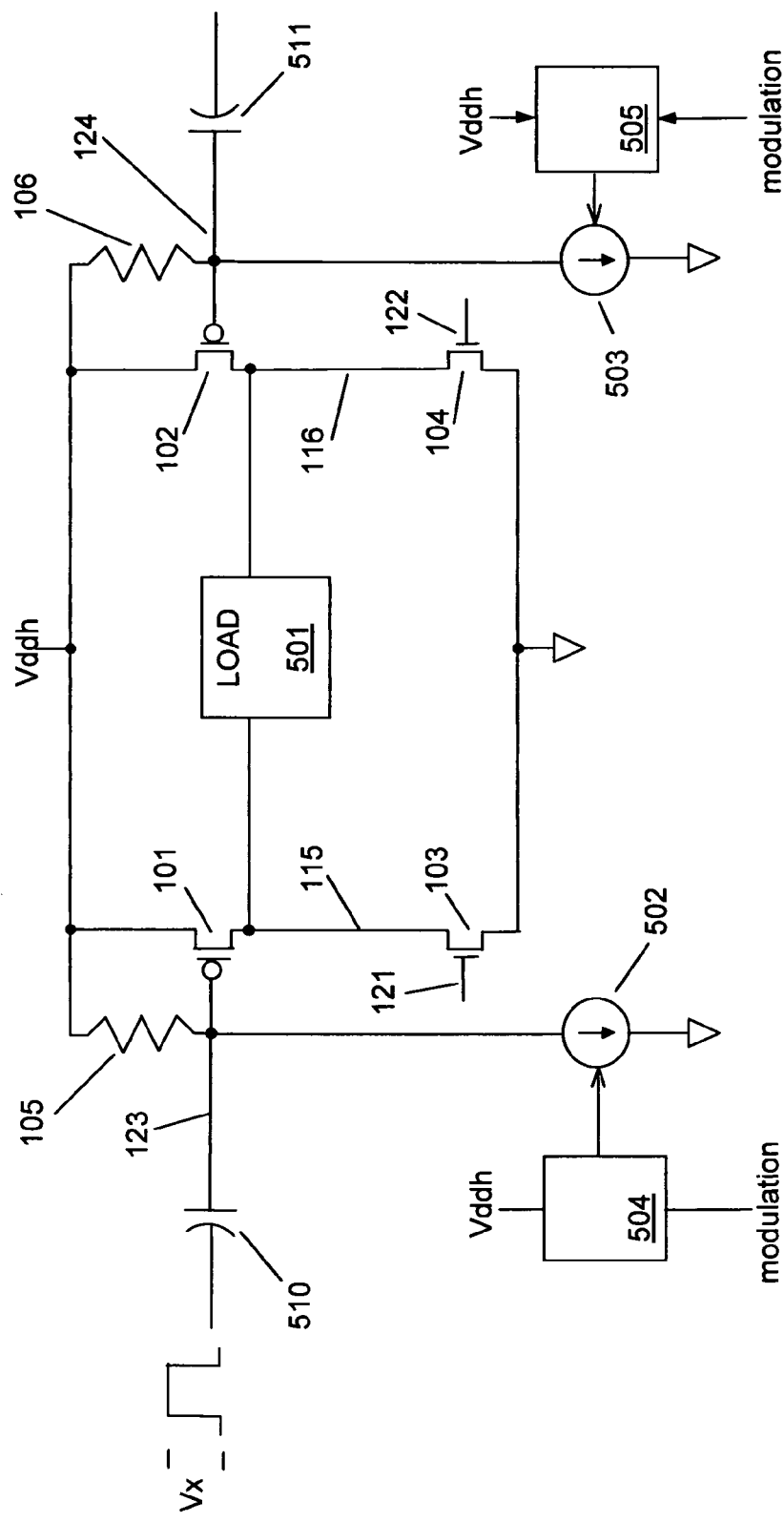
FIG. 5 is a schematic block diagram of a generalized bias network for an H-bridge having capacitively coupled pulse width modulated input signals and outputs that are substantially independent of duty cycle variations in the input signal, that tracks changes in power supply, and that is operable to shut down at least the high-side driver transistors.

Referring to FIG. 5, an H-bridge-based capacitively-coupled level-shifter with a generalized bias network having an output that is a determined based, at least in part, on the power supply of the H-bridge, and at least the modulation of the input signal is shown. More particularly, a PFET 101 is coupled source-to-drain between a power supply node Vddh and a first H-bridge output node 115, and an NFET 103 is coupled drain-to-source between node 115 and ground. NFET 103 has a gate terminal 121. A PFET 102 is coupled source-to-drain between the power supply node Vddh and a second H-bridge output node 116, and an NFET 104 is coupled drain-to-source between node 116 and ground. NFET 104 has a gate terminal 122. A load 501 is coupled between H-bridge output nodes 115, 116.

Still referring to FIG. 5, a first resistor 105 is coupled between Vddh and a node 123, a gate electrode of PFET 101 is coupled to node 123, one terminal of a capacitor 510 is coupled to node 123, and a current source 502 is coupled between node 123 and ground. Current source 502 is coupled to control circuitry 504. Control circuitry 504 receives information indicative of the H-bridge supply voltage and indicative of the modulation of the H-bridge input signals. A second resistor 106 is coupled between Vddh and a node 124, a gate electrode of PFET 102 is coupled to node 124, one terminal of a capacitor 511 is coupled to node 124, and a current source 503 is coupled between node 124 and ground. Current source 503 is coupled to control circuitry 505. Control circuitry 505 receives information indicative of the H-bridge supply voltage and indicative of the modulation of the H-bridge input signals. It will be appreciated that input signals are coupled to the H-bridge high-side transistors through capacitors 510, 511. In the illustrative embodiments pulse-width modulated signals are being coupled, and more particularly these are digital, or logic signals.

In operation, the illustrative circuitry of FIG. 5 has a supply voltage, Vddh, which is greater than the voltage of the input signal Vx. In order for the input voltage to turn off PFET 101 in this embodiment, input node 123 is biased up. Since the bias voltage at input node 123 (as well as at input node 124) can be affected by changes in the duty cycle of the pulse-width modulated input signals, this embodiment of the present invention, rather than using fixed-value resistive elements, is provided with circuitry that is operable, responsive to changes in, for example, input duty cycle, to maintain the desired bias value. It will be appreciated that in addition to maintaining a predetermined bias voltage, the configuration of FIG. 5 is operable, responsive to one or more control signals, to modify the bias voltage.

It will be further appreciated that current sources 502, 503 can be set such that no current flows, respectively, between node 123 and ground, and node 124 and ground. In this way, the voltage at the gate electrodes of PFETs 101, 102 will rise to Vddh and therefore PFETs 101, 102 will turn off. The ability to turn off the PFET driver devices enable a short-circuit protection feature. That is, upon detecting that the H-bridge output nodes have been shorted, for example, to ground, the bias point is increased to prevent the large short-circuit currents that could cause damage.

Figure 6:
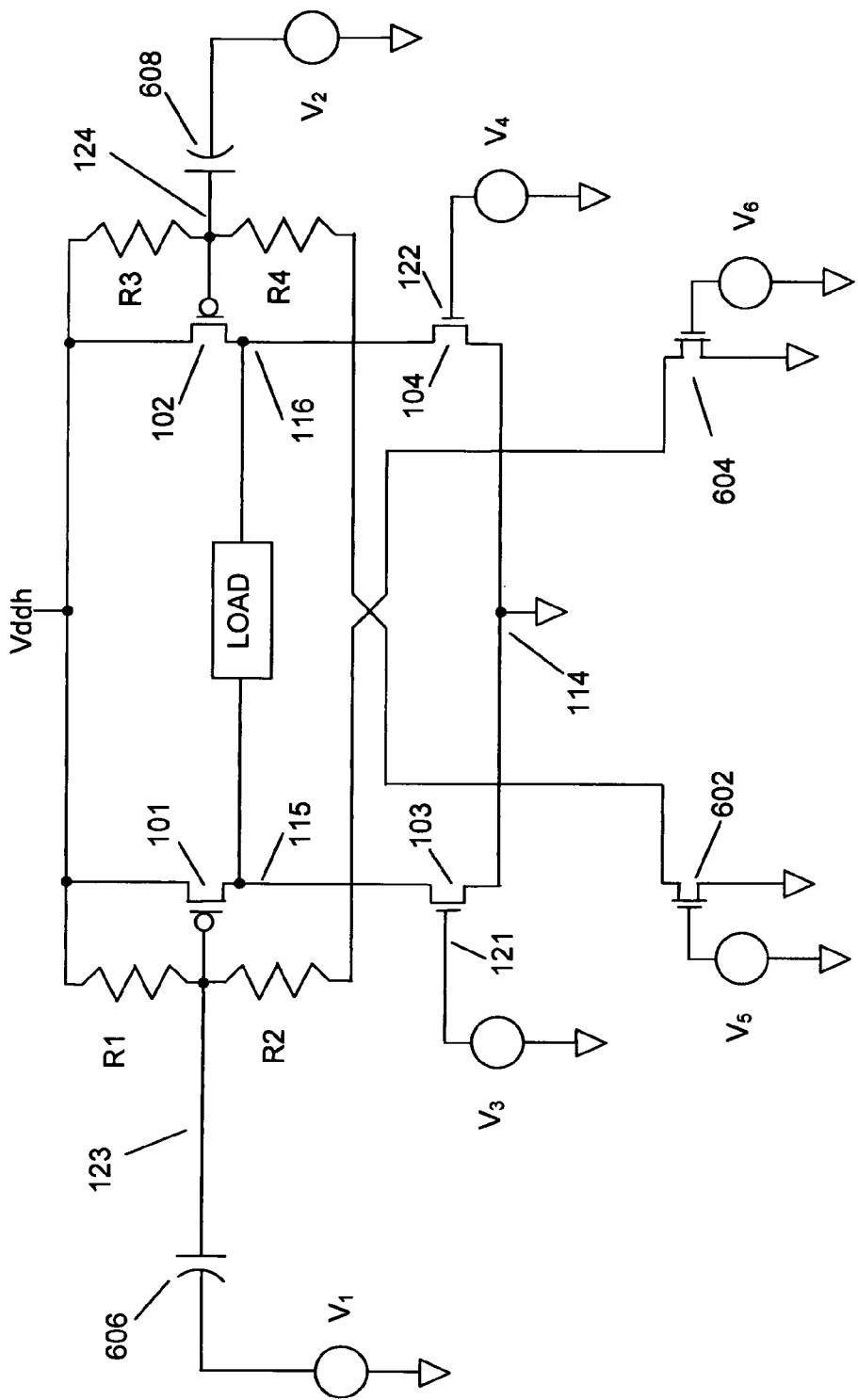
FIG. 6 is a schematic diagram of an H-bridge and bias network, the H-bridge having capacitively coupled pulse width modulated input signals and outputs that are substantially independent of duty cycle variations in the input signal, that tracks changes in power supply, and wherein the bias networks are operable to shut down at least the high-side driver transistors.

It is noted that the currents of current sources 502 and 503 may be flowing as a result of arithmetic and/or logical operations in any combination of linear and/or switched signals applied to a circuit structure that has the net effect of providing average currents so as to stabilize nodes 123 and 124 in the face of input duty-cycle variations (e.g., variations in signals V1 and V2 of FIG. 6) and/or variations in Vddh Referring to FIG. 6, a schematic diagram of an illustrative level-shifting H-bridge amplifier having biasing networks that each include at least one switching element which operates to control the average current through their respective circuitry such that the desired bias voltage is achieved, is shown and described. It is noted that the desired bias voltage may be one that is held substantially constant, one that is modified in view of changes in input and/or power supply voltages, or one that is set to turn off high-side driver transistors during certain conditions, such as for example, short-circuit conditions. The aforementioned switching elements are typically transistors.

Still referring to FIG. 6, a PFET 101 is coupled source-to-drain between a power supply node Vddh and a first H-bridge output node 115, and has a gate terminal coupled to a node 123. An NFET 103 is coupled drain-to-source between node 115 and ground. NFET 103 has a gate terminal 121. A PFET 102 is coupled source-to-drain between the power supply node Vddh and a second H-bridge output node 116, and an NFET 104 is coupled drain-to-source between node 116 and ground. NFET 104 has a gate terminal 122. A first signal source V1 is capacitively coupled through capacitor 606 to node 123; and a second signal source V2 is capacitively coupled through capacitor 608 to node 124. Signal sources V1 and V2 are the differential pulse-width modulated input signals. A load is coupled between H-bridge output nodes 115, 116.

A first bias network has an output coupled to node 123. A second bias network has an output coupled to node 124. The first bias network includes a resistor R1 coupled between the H-bridge power supply node and node 123; a resistor R2 coupled between node 123 and the drain of an NFET 604, in which NFET 604 is coupled drain-to-source between R2 and ground as shown in FIG. 6. The gate terminal of NFET 604 is coupled to a signal source V6. The second bias network includes a resistor R3 coupled between the H-bridge power supply node and node 124; a resistor R4 coupled between node 124 and the drain of an NFET 602, in which NFET 602 is coupled drain-to-source between R4 and ground as shown in FIG. 6. The gate terminal of NFET 602 is coupled to a signal source V5. It can be seen that each of the first and second bias networks provides a switchable path between the H-bridge power supply and ground, and further provides an output node coupled, respectively, to the gates of PFETs 101, 102. In operation, signal sources V5 and V6 are switched so that the average current flow through the bias networks generates the desired bias voltage. Those skilled in the art and having the benefit of the present disclosure will appreciate that the voltage at the output of these bias networks can be lowered or raised as a result of switching on NFETs 602, 604 for longer or shorter amounts of time respectively.

In some embodiments, the gate terminals of NFETs 103 and 602 are tied together, and the gate terminals of NFETs 122 and 604 are tied together.

Still referring to FIG. 6, it can be seen that by turning off NFETs 602 and 604, the outputs of the bias networks will rise to Vddh, i.e., the H-bridge supply voltage. In this way, the value of Vgs for PFETs 101 and 102 is zero, and therefore current flow through these PFETs should be turned off. Additionally, by stopping, or disabling, the switching of signal sources $V_1$ and $V_2$, voltage changes will not be capacitively coupled onto the PFET gate terminals, and consequently, the PFETs will remain turned off.

Figure 7:
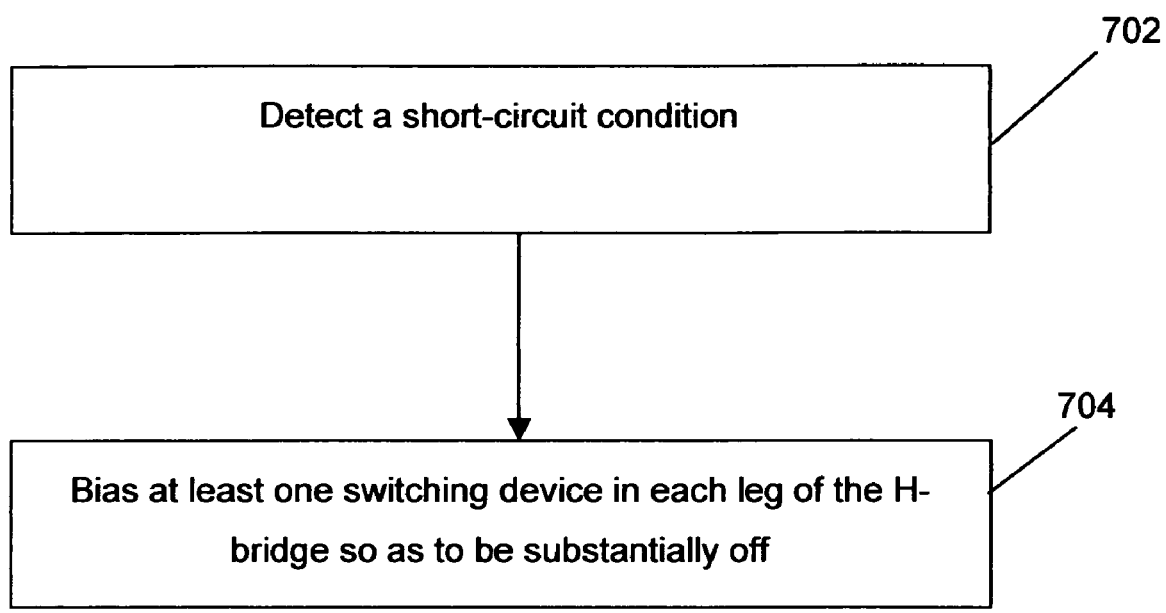
FIG. 7 is a flow diagram illustrating one method of detecting a short-circuit condition and operating the bias networks to turn off the high-side transistors of an H-bridge in accordance with the present invention.

FIG. 7 shows one illustrative method of operating an H-bridge amplifier that is configured to receive a capacitively-coupled pulse width modulated input signal, and includes detecting 702 a short-circuit condition, and responsive thereto, and wherein each of the at least one switching devices in each leg of the H-bridge is disposed between the H-bridge power supply node and the output node of that respective leg.

Another illustrative method of operating a level-shifting H-bridge amplifier, includes biasing the input node of a first high-side transistor of the H-bridge to a predetermined value; capacitively coupling a digital signal onto the biased input node of a first high-side transistor of the H-bridge; detecting a short-circuit condition; and biasing, responsive to detection of the short-circuit condition, the input node of the first high-side transistor such that current flow through that transistor is substantially turned off. Additionally, disabling switching of the digital signal helps to maintain the bias point for the high-side transistors, after the short-circuit detection, that keeps the current flow between the H-bridge power supply and the H-bridge output nodes turned off.

Conclusion

It is to be understood that the present invention is not limited to the embodiments described above, but encompasses any and all embodiments within the scope of the subjoined claims and their equivalents.

What is claimed is:

1. A circuit, comprising:
an H-bridge arrangement of field effect transistors comprising:
a first high-side transistor comprising three terminals, a first terminal of the first high-side transistor being coupled to a power supply node and a second terminal of the first high-side transistor being coupled to a first output node,
a second high-side transistor comprising three terminals, a first terminal of the second high-side transistor being coupled to the power supply node and a second terminal of the second high-side transistor being coupled to a second output node,
a first low-side transistor comprising three terminals, a first terminal of the first low-side transistor being coupled to the first output node and a second terminal of the first low-side transistor being coupled to a ground node, and
a second low-side transistor comprising three terminals, a first terminal of the second low-side transistor being coupled to the second output node and a second terminal of the second low-side transistor being coupled to the ground node;
a first bias network comprising a first resistive element, a second resistive element and a first switching element, the first resistive element being coupled between the power supply node and a third terminal of the first high-side transistor, the second resistive element being coupled between the third terminal of the first high-side transistor and a first terminal of the first switching element, and a second terminal of the first switching element being coupled to the ground node, the first switching element capable of selectively providing a DC path from the first terminal of the first switching element to the ground node and substantially no DC path from the first terminal of the first switching element to the ground node, and the first switching element being different from the first low-side transistor and from the second low-side transistor; and
a second bias network comprising a third resistive element, a fourth resistive element and second switching element, the third resistive element being coupled between the power supply node and a third terminal of the second high-side transistor, the fourth resistive element being coupled between the third terminal of the second high-side transistor and a first terminal of the second switching element, and a second terminal of the first switching element being coupled to the ground node, the second switching element capable of selectively providing a DC path from the first terminal of the second switching element to the ground node and substantially no DC path from the first terminal of the second switching element to the ground node, and the second switching element being different from the first low-side transistor and from the second low-side transistor,
the third terminal of the first switching element being coupled to a first control signal source, the first control signal source being capable of selectively switching the first switching element off so that there is substantially no DC path through the first switching element from the first terminal of the first switching element to the ground node.

2. The circuit according to claim 1, further comprising:
a first input terminal capacitively coupled to the third terminal of the first high-side transistor; and
a second input terminal capacitively coupled to the third terminal of the second high-side transistor.

3. The circuit according to claim 2, wherein a third terminal of the second switching element being coupled to a second control signal source, the second control signal source being capable of selectively switching the second switching element off so that there is substantially no DC path through the second switching element from the first terminal of the second switching element to the ground node.

4. The circuit according to claim 3, wherein the first resistive element comprises a resistor, the second resistive element comprises a resistor, and the first switching element comprises an N-type FET or an NPN bipolar transistor.

5. The circuit according to claim 3, wherein the third resistive element comprises a resistor, the fourth resistive element comprises a resistor, and the second switching element comprises an N-type Field Effect Transistor (FET) or an NPN bipolar transistor.

6. The circuit according to claim 2, wherein the first resistive element comprises a resistor, the second resistive element comprises a resistor, and the first switching element comprises an N-type Field Effect Transistor (FET) or an NPN bipolar transistor.

7. The circuit according to claim 2, wherein the third resistive element comprises a resistor, the fourth resistive element comprises a resistor, and the second switching element comprises an N-type Field Effect Transistor (FET) or an NPN bipolar transistor.

8. The circuit according to claim 1, wherein a third terminal of the second switching element being coupled to a second control signal source, the second control signal source being capable of selectively switching the second switching element off so that there is substantially no DC path through the second switching element from the first terminal of the second switching element to the ground node.

9. The circuit according to claim 1, wherein the first resistive element comprises a resistor, the second resistive element comprises a resistor, and the first switching element comprises an N-type Field Effect Transistor (FET) or an NPN bipolar transistor.

10. The circuit according to claim 1, wherein the third resistive element comprises a resistor, the fourth resistive element comprises a resistor, and the second switching element comprises an N-type Field Effect Transistor (FET) or an NPN bipolar transistor.

11. A level-shifter circuit, comprising:
a first P-type Field Effect Transistor (PFET) coupled source-to-drain between a first power supply node and a first output node;
a first N-type Field Effect Transistor (NFET) coupled drain-to-source between the first output node and a second power supply node;
a second PFET coupled source-to-drain between the first power supply node and a second output node;
a second NFET coupled drain-to-source between the second output node and the second power supply node;
a first resistor coupled between the first power supply node and a gate electrode of the first PFET;
a second resistor coupled between the gate electrode of the first PFET and a first intermediate node;
a third resistor coupled between the power supply node and the gate electrode of the second PFET;
a fourth resistor coupled between the gate electrode of the second PFET and a second intermediate node;
a first switchable element coupled between the first intermediate node and ground, the first switchable element being different from the first NFET and from the second NFET, and the first switchable element being coupled to a first control signal source and responsive to a control signal from the first control signal to turn off so that there is substantially no DC path through the first resistor, the second resistor and the first switchable element between the first power supply node to the second power supply node;
a second switchable element coupled between the second intermediate node and ground, the second switchable element being different from the first NFET and from the second NFET, and the second switchable element is coupled to a second control signal source and responsive to a control signal from the second control signal to turn off so that there is substantially no DC path through the third resistor, the fourth resistor and the second switchable element between the first power supply node to the second power supply node;
a first capacitor comprising a first terminal and a second terminal, the first terminal being coupled to the gate electrode of the first PFET and the second terminal being coupled to a first signal source; and
a second capacitor comprising a first terminal and a second terminal, the first terminal being coupled to the gate electrode of the second PFET, and the second terminal of the second capacitor being coupled to a second signal source,
the first power supply node being adapted to receive a voltage greater than the magnitude of a voltage of input signals provided by the first signal source and the second signal source.

12. The level-shifter according to claim 11, wherein the first switchable element comprises an NFET or an NPN bipolar transistor, and the second switchable element comprises an NFET or an NPN bipolar transistor.

13. The level-shifter according to claim 12, wherein the first NFET comprises a gate terminal and the second switchable element comprises a gate terminal that is coupled to the gate terminal of the first NFET; and
wherein the second NFET comprises a gate terminal and the first switchable element comprises a gate terminal that is coupled to the gate terminal of the second NFET.

14. A method of operating an amplifier comprising an H-bridge arrangement of field-effect transistors, the H-bridge arrangement of field-effect transistors comprising:
a first H-bridge leg comprising a first high-side transistor comprising three terminals, a first terminal of the first high-side transistor being coupled to a power supply node and a second terminal of the first high-side transistor being coupled to a first output node, and a first low-side transistor comprising three terminals, a first terminal of the first low-side transistor being coupled to the first output node and a second terminal of the first low-side transistor being coupled to a ground node, and
a second H-bridge leg comprising a second high-side transistor comprising three terminals, a first terminal of the second high-side transistor being coupled to the power supply node and a second terminal of the second high-side transistor being coupled to a second output node, and a second low-side transistor comprising three terminals, a first terminal of the second low-side transistor being coupled to the second output node and a second terminal of the second low-side transistor being coupled to the ground node;
a first bias network comprising a first resistive element, a second resistive element and a first switching element, the first resistive element being coupled between the power supply node and a third terminal of the first high-side transistor, the second resistive element being coupled between the third terminal of the first high-side transistor and a first terminal of the first switching element, and a second terminal of the first switching element being coupled to the ground node, the first switching element capable of selectively providing a DC path from the first terminal of the first switching element to the ground node and substantially no DC path from the first terminal of the first switching element to the ground node, and the first switching element being different from the first low-side transistor and from the second low-side transistor; and a second bias network comprising a third resistive element, a fourth resistive element and second switching element, the third resistive element being coupled between the power supply node and the third terminal of the second high-side transistor, the fourth resistive element being coupled between the third terminal of the second high-side transistor and a first terminal of the second switching element, and a second terminal of the first switching element being coupled to the ground node, the second switching element capable of selectively providing a DC path from the first terminal of the second switching element to the ground node and substantially no DC path from the first terminal of the first switching element to the ground node, and the second switching element being different from the first low-side transistor and from the second low-side transistor, a third terminal of the first switching element being coupled to a first control signal source, the first control signal source being capable of operatively selectively switch the first switching element off so that there is substantially no DC path through the first bias network between the H-bridge power supply node and the ground node, the method comprising:

detecting a short-circuit condition; and in response to the detected short-circuit condition, biasing substantially off at least one transistor in each of the first leg and the second leg of the H-bridge arrangement.

15. The method according to claim 14, wherein detecting a short-circuit condition comprises detecting a predetermined drop in a voltage of the power supply node.

16. The method according to claim 14, wherein detecting a short-circuit condition comprises detecting a predetermined rise in temperature.

17. The method according to claim 14, wherein detecting a short-circuit condition comprises detecting a current flow in the power supply node that is greater than a predetermined amount of current flow.

18. The method according to claim 14, further comprising:

biasing the third terminal of the first high-side transistor to a predetermined bias value;

capacitively coupling a digital signal onto the biased third terminal of the first high-side transistor;

detecting the short-circuit condition; and in response to the detected short-circuit condition, biasing the third terminal of the first high-side transistor to substantially turn off current flow through the first high-side transistor.

19. The method according to claim 18, wherein a third terminal of the second switching element being coupled to a second control signal source, the second control signal source being capable of selectively switching the second switching element off so that there is substantially no DC path through the second bias network between the H-bridge power supply node and the ground node.

20. The method according to claim 19, further comprising:

biasing the third terminal of the second high-side transistor to a predetermined bias value;

capacitively coupling a digital signal onto the biased third terminal of the second high-side transistor;

detecting the short-circuit condition; and in response to the detected short-circuit condition, biasing the third terminal of the second high-side transistor to substantially turn off current flow through the second high-side transistor.

* * * * *